United States Patent [19]
McDonald et al.

[11] Patent Number: 4,750,181
[45] Date of Patent: Jun. 7, 1988

[54] DYNAMIC CIRCUIT CHECKING APPARATUS USING DATA INPUT AND OUTPUT COMPARISONS FOR TESTING THE DATA INTEGRITY OF A CIRCUIT

[75] Inventors: Mark A. McDonald, Dallas; Michael A. Zeeff, Richardson, both of Tex.

[73] Assignee: Rockwell International Corporation, El Segundo, Calif.

[21] Appl. No.: 927,212

[22] Filed: Nov. 5, 1986

[51] Int. Cl.$^4$ .................. G06F 11/00; G01R 31/28
[52] U.S. Cl. ................................... 371/71; 371/24
[58] Field of Search .................. 371/24, 67, 68, 71

[56] References Cited

U.S. PATENT DOCUMENTS

| | | | |
|---|---|---|---|
| 3,548,175 | 12/1970 | Tomlin | 371/71 |
| 4,380,068 | 4/1983 | de Couasnon | 371/24 |
| 4,646,328 | 2/1987 | Riou | 371/67 |
| 4,667,330 | 5/1987 | Kumagai | 371/71 |
| 4,683,569 | 7/1987 | Rubin | 371/68 |
| 4,685,053 | 8/1987 | Hattori et al. | 371/71 |

Primary Examiner—Charles E. Atkinson
Attorney, Agent, or Firm—Bruce C. Lutz; V. L. Sewell; H. Fredrick Hamann

[57] ABSTRACT

The present invention relates to a checking circuit concept which determines the integrity of data passing through a further circuit to be checked such as an elastic buffer. The concept is based on the fact that a serial data stream entering an elastic buffer must exit the elastic buffer intact without bit errors. Since the bit delay through the elastic buffer is a variable, it becomes difficult to test bit integrity. The present invention determines the bit integrity by sampling and storing a sequential set of data entering the elastic buffer and successively comparing it to data exiting the buffer. If no errors are present, the stored input data will match the data exiting the elastic buffer within N bits where N equals the storage bit location size of the elastic buffer.

5 Claims, 5 Drawing Sheets

DYNAMIC CIRCUIT CHECKING APPARATUS USING DATA INPUT AND OUTPUT COMPARISONS FOR TESTING THE DATA INTEGRITY OF A CIRCUIT

THE INVENTION

The present invention is generally related to electronics and more specifically related to dynamic testing of electronic circuits. Even more specifically, the concept is related to checking data input to a circuit with data output from a circuit for a number of compares equal to the maximum time required for the data to travel through the circuit. If a positive comparison is not found within that time, an error indication is issued.

BACKGROUND

Typical prior art approaches to determining bit integrity to a circuit, such as an elastic buffer, included using another elastic buffer in parallel with the elastic buffer in the path to be tested, and sending data through both identical elastic buffer paths and comparing the output of both paths. Such an approach is shown in U.S. Pat. No. 4,601,028 in the name of Huffman et al. and assigned to the same assignee as the present invention. The disadvantage to such an approach is the amount of logic and circuitry required to test the data path. By eliminating the need for a second elastic buffer, this invention requires less circuitry and, therefore, less cost, greater reliability and smaller physical size.

Another common prior art approach for accurately determining the time delay of data through a circuit being tested, is to use a phase-locked loop to coordinate the clocks at the input and output circuitry, thus eliminating the need for an elastic buffer. It is not always practical to perform such a phase lock approach, and thus elastic buffers are required.

The environment for the circuitry to be checked, in one embodiment of the inventive concept, concerns a situation where the data transmission rate is greater than one megabit per second of information being transmitted. If a circuit is checked even as little as 10% of the time, it is still checked many times per second. Thus, if data input to a circuit is sampled and held in a given register, and then data being output from this same circuit is compared with that held in the input register, and the comparison is checked for each clock subsequent thereto for a number of clocks equal to the maximum possible time delay in the circuit, a definite determination can be made as to whether or not the data is passing through the circuit correctly. Although there is certainly a possibility that the detected comparison will be to a set of data identical in logic value to, but different from the data actually input, the statistical probability is that this will only occur a very small percentage of the time. When the checking occurs at a rate of many times per second, the determination of problems will still be correctly reported very quickly. If an error is indicated, the circuitry involved switches the transmission of data to another channel. During this switching operation, even though it may take a matter of milliseconds, there is a considerable loss of data. Thus, it is undesirable to switch channels unless there really is a problem.

The present concept is thus based upon the realization that occasional "false" indications of correct compares is OK when a large number of compares are being performed as long as an error signal indicating a "bad" compare is always correct.

It is an object of the present invention to provide a new and novel approach to checking a circuit by comparing data input to and output from a circuit. Other objects and advantages of the present inventive concept may be ascertained from a reading of the specification and appended claims in conjunction with the drawings, wherein:

DETAILED DESCRIPTION

Figure 1:
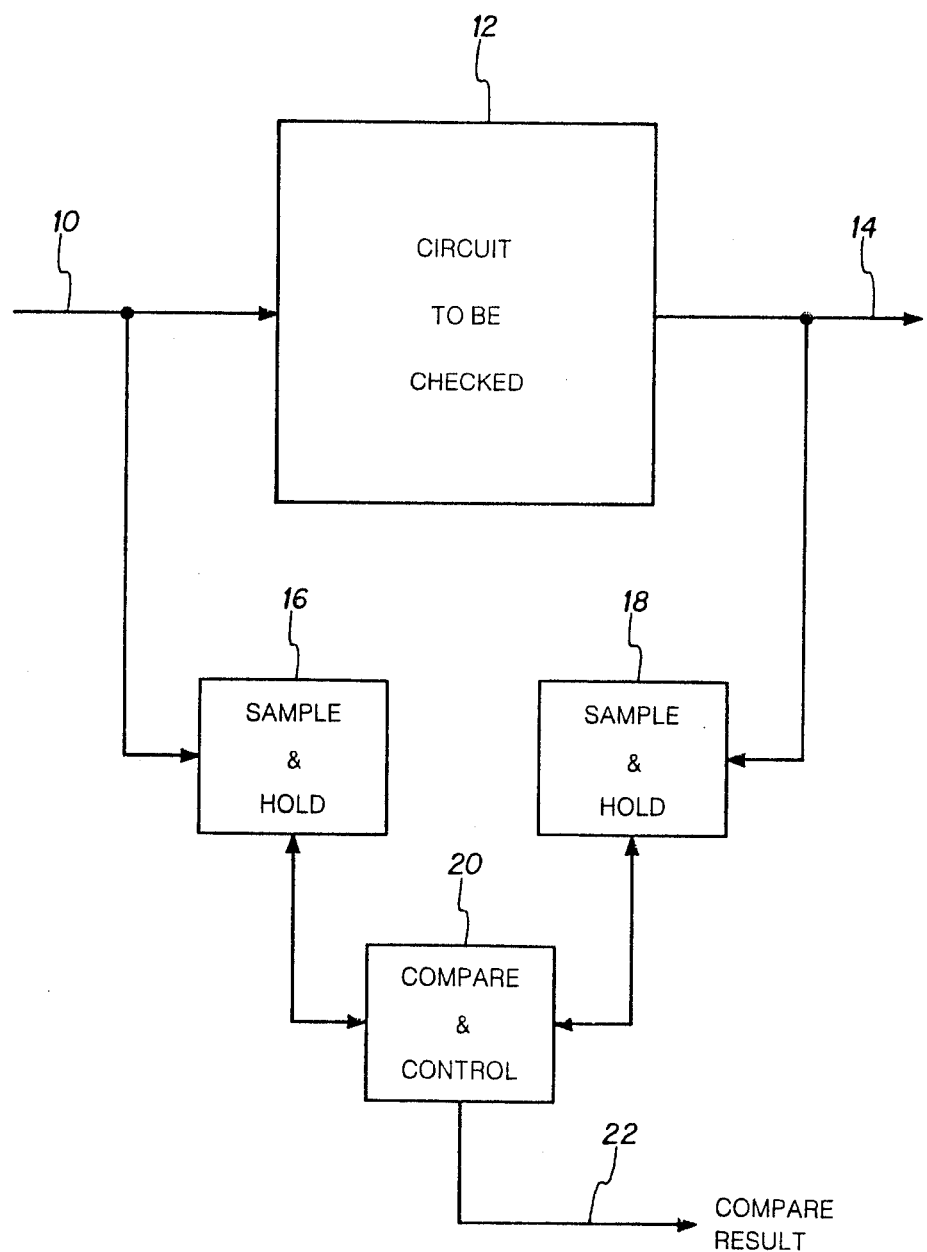
FIG. 1 is a block diagram of the basic inventive concept.

In FIG. 1, a signal on a lead 10 is input to a block 12, which is a circuit to be checked, and data is output from this block 12 on a lead 14 to downstream circuitry. This block 12 may be a single component, such as an elastic buffer, or may be a plurality of circuit components. In any event, the data on lead 10 is applied to a sample and hold block 16 while the data output on lead 14 is supplied to a sample and hold block 18. A compare and control block 20 is utilized to sample the data in block 16, and compare it with the data in block 18, wherein the block 18 data is changing upon each clock cycle. If the control block 20 obtains an appropriate comparison, it provides a compare result signal of a positive compare on lead 22 and commences a new checking operation. If on the other hand, there is no comparison within N compares where N is the maximum delay through the block 12, an error signal is supplied on lead 22 and the checking process is commenced again.

Figure 2:
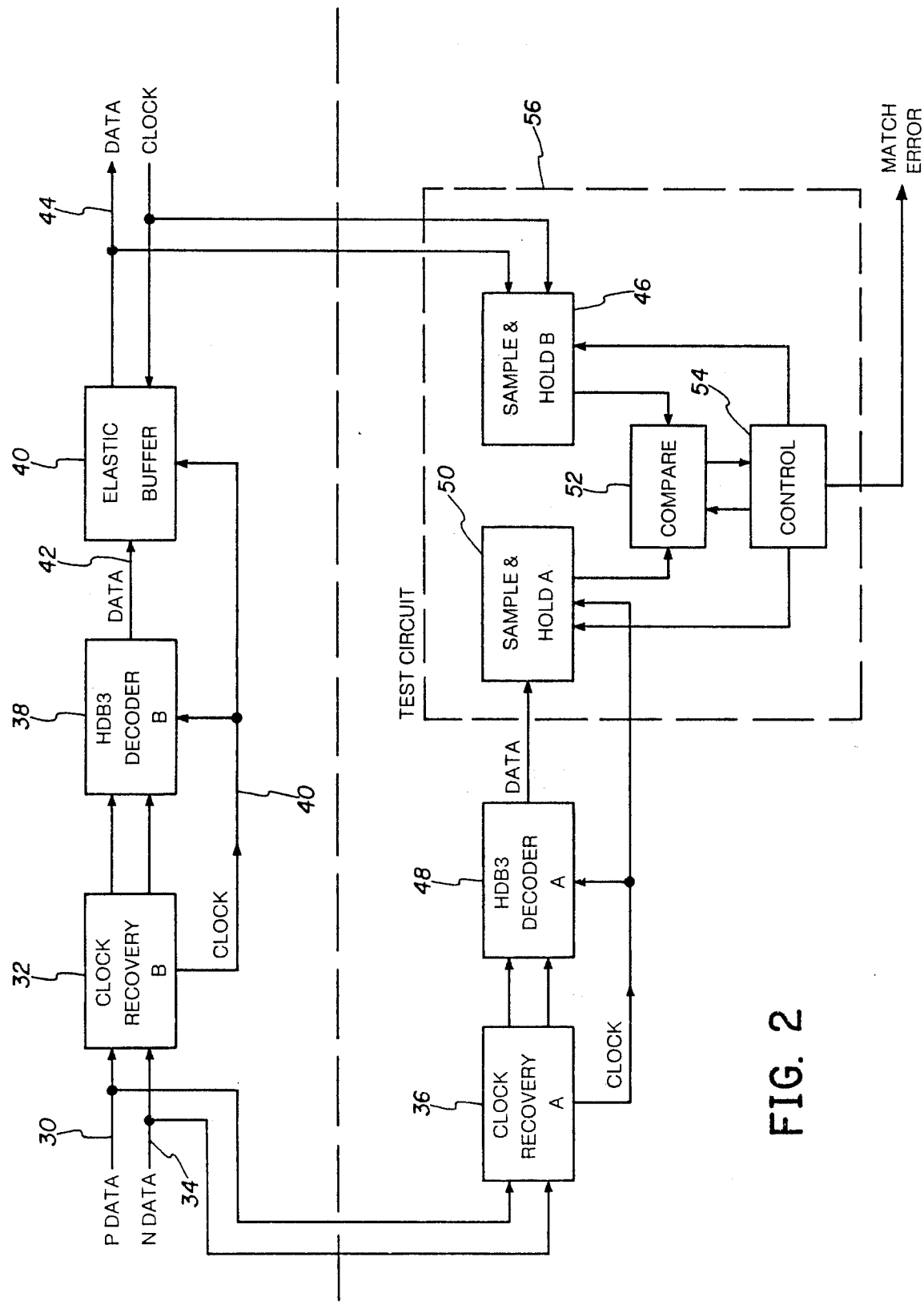
FIG. 2 is a block diagram of the inventive concept as applied to a specific embodiment of the invention.

In FIG. 2, bipolar positive data is input on a lead 30 to a clock recovery circuit 32, while negative data is input on a lead 34 to this same recovery block 32. The data on both leads 30 and 34 is supplied to a second clock recovery circuit 36. The data is output from clock recovery block 32 to a decoder block 38, which is clocked by a clock signal appearing on lead 40 from clock recovery block 32, and applied both to block 38 and to an elastic buffer block 41. Data is output from the decoder 38 on a lead 42 to the buffer 41. Data is then subsequently output from buffer 40 on a lead 44 to downstream circuitry, as well as being supplied to a sample and hold block 46. The clock recovery circuit 36 supplies clock signals to a decoder 48 and to a further sample and hold circuit 50. Data is supplied from clock recovery circuit 36 through decoder 48 and to the sample and hold circuit 50. A COMPARE block 52 compares signals received, indicating the relative contents of sampling circuits 46 and 50 in accordance with signals received from a control block 54. Control block 54 is not only connected to compare circuit 52, but also to the sample and hold circuits 46 and 50. A match error signal is supplied as an output from control block 54 to provide an indication to switching circuitry whenever there is a lack of comparison over the time necessary for data to pass from lead 42 to output data lead 44. A dash line 56 encloses blocks 46, 50, 52 and 54 as being the basic inventive concept although the complete lower half of FIG. 2 comprises the test circuitry for checking the data being passed through the blocks 32, 38 and 40. The circuit as shown in FIG. 2 provides a composite testing circuit, where part of the circuitry of the main data path is duplicated and part of it is being tested directly.

Figure 3:
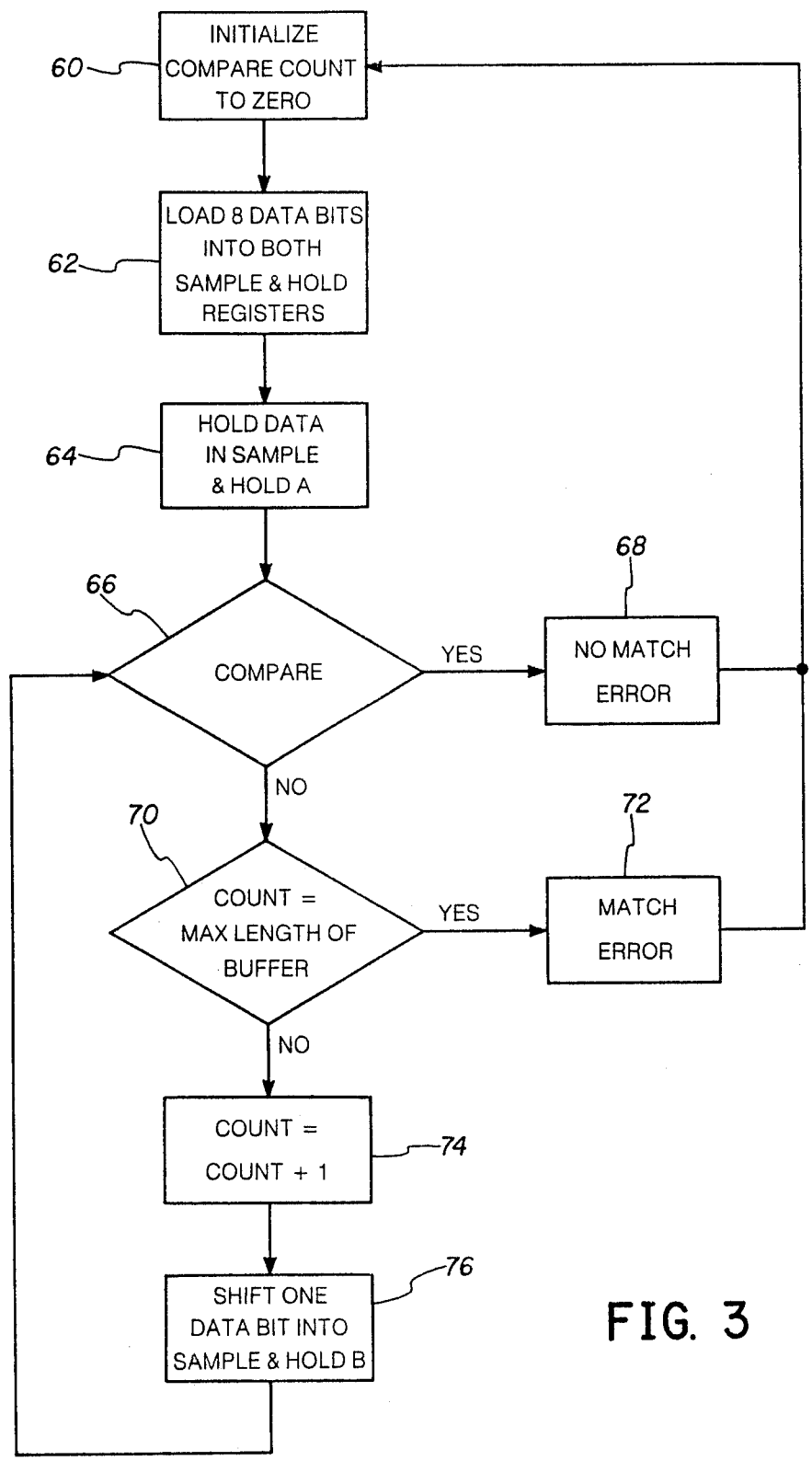
FIG. 3 is a flow diagram of the control portion of the inventive concep for either FIGS. 1 or 2.

In FIG. 3, an INITIALIZE COMPARE COUNT TO ZERO block 60 is shown supplying signals to a LOAD 8 DATA BITS INTO BOTH SAMPLE AND HOLD REGISTERS block 62. Signals are then passed to a HOLD DATA IN SAMPLE AND HOLD A block 64. From there signals are passed to a compare block 66, which has a YES output to a NO MATCH ERROR block 68 and to a NO output to a COUNT EQUAL MAXIMUM LENGTH OF BUFFER decision block 70. A YES output of decision block 70 provides signals to a MATCH ERROR block 72. Blocks 68 and 72 provide signals back to the initialization block 60. A NO output from decision block 70 provides signals to a COUNT EQUAL COUNT PLUS ONE block 74, which then provides signals to a SHIFT ONE DATA BIT INTO SAMPLE AND HOLD B block 76 which then returns signals to the COMPARE block 66.

Figure 4A:
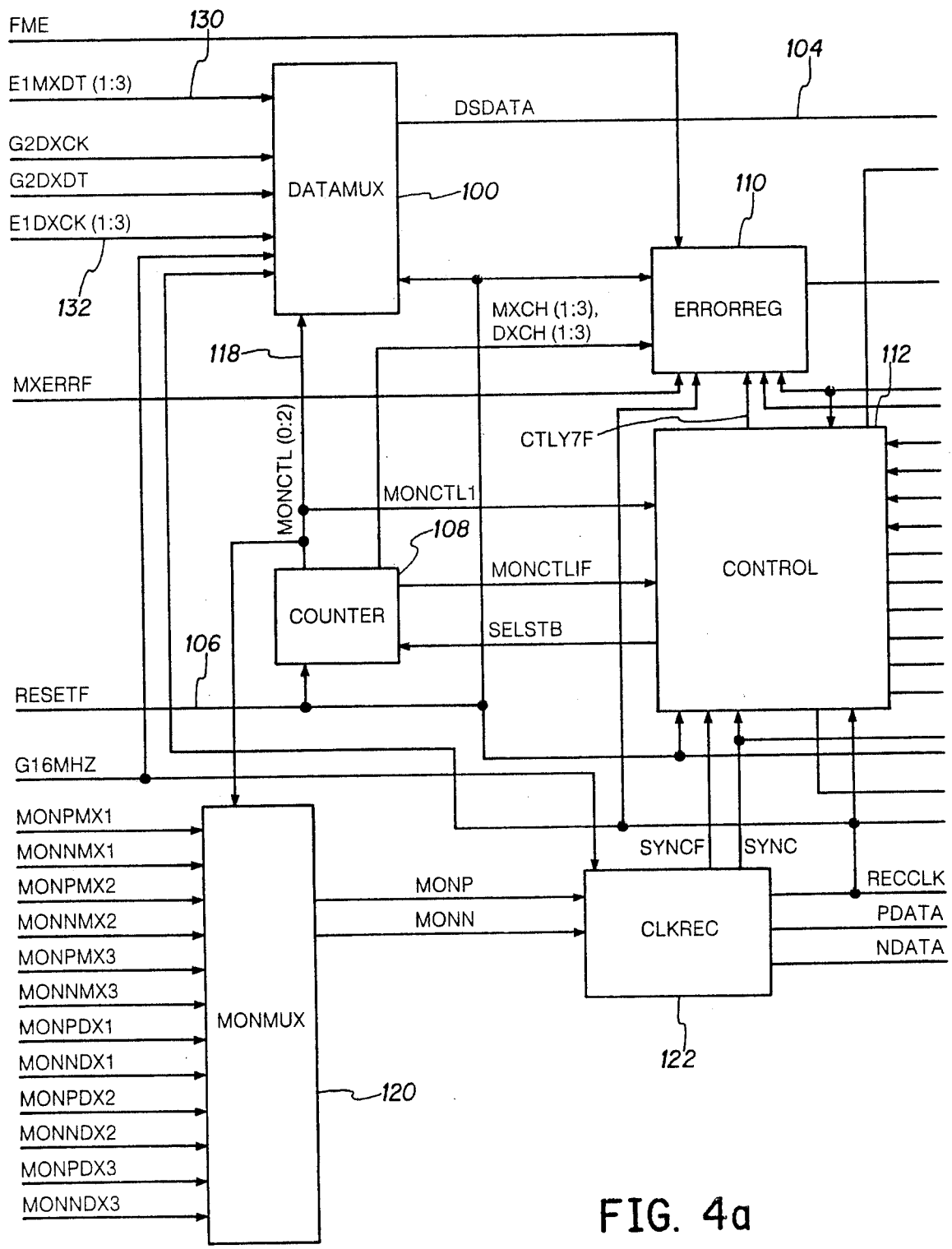
FIG. 4, comprised of FIGS. 4a and 4b, is a block diagram of the inventive concept as applied to a preferred embodiment, wherein the concept provides a multiplexing type checking operation of different types of circuits.
Figure 4B:
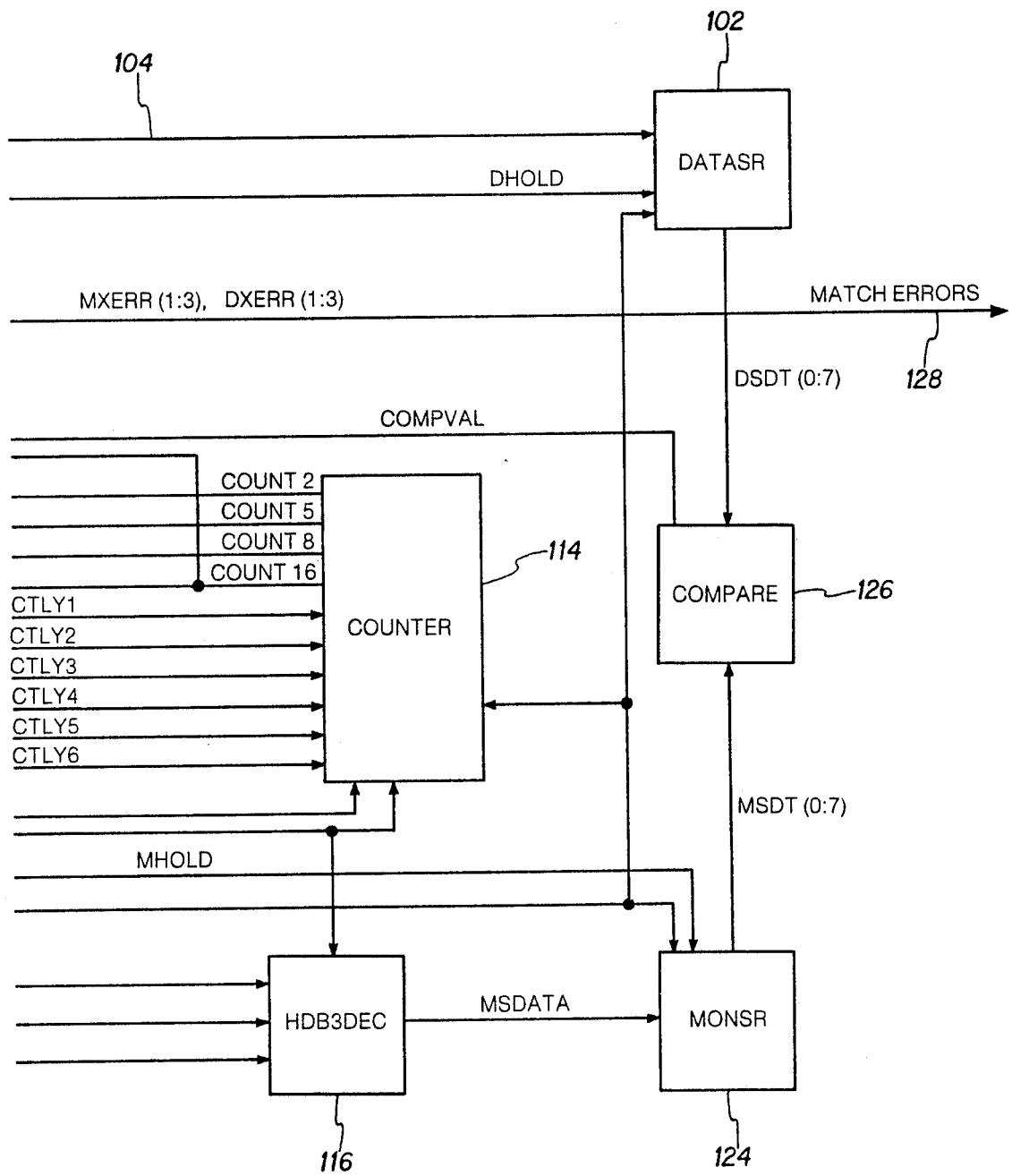

In FIG. 4, the DATAMUX block 100 is connected to a data shift register (DATASR) block 102 via a lead 104, and receives control inputs on a line 106 which also supplies control signals to a COUNTER block 108, an error register (ERRORREG) 110, a CONTROL block 112, and a COUNTER 114, as well as to a HDB3DEC block 116. The counter 108 supplies signals on a lead 118 to the DATAMUX block 100, as well as to a MONMUX block 120. The MONMUX block 120 receives a plurality of inputs as shown and supplies outputs to a clock recovery block 122. Clock recovery block (CLKREC) 122 supplies signals both to the control 112 and to the block 116. An output of block 116 supplies data to a monitor shift register block (MONSR) 124, which provides output signals to a COMPARE block 126. The COMPARE block 126 also receives input from the data shift register 102, and provides an indication of whether or not there is a compare to the CONTROL block 112, as well as to error register 110. Match errors are provided as an output of FIG. 4 on a lead 128.

The labeling of other leads within FIG. 4, which are not numerically designated, are provided for use in referencing specifics with respect to later discussions herein, and in providing correspondence with the detailed drawings which are included as an unpublished appendix in the Patent and Trademark Office file.

OPERATION

The circuit of FIG. 1 looks very much like the prior art, in that the output is sampled and compared with the input. The difference being, that in the prior art, the comparison occurred at a known or determinable time, due to the fact that the circuit 12 had a known time delay, or that some duplicate circuitry was used to determine exactly the time delay would be. Thus, FIG. 1 differs from the prior art in that a plurality of samples is compared, and if no comparison occurs within the maximum time necessary for the data to traverse circuit 12, then a negative compare result is issued on lead 22. On the other hand, if a compare is obtained, the result issued on lead 22 indicates that such a compare occurred. While it is potentially possible that the positive compare is comparing different pieces of data that just happen to be logically identical, statistically this would occur so seldom as to not cause a problem in a situation where the circuit is being compared very often relative to the amount of bad data which would endanger circuit operation.

FIG. 2 illustrates an embodiment of the concept as applied to an actual implementation where a portion of the circuitry, such as clock recovery circuit 32 and decoder 38, is simple and inexpensive to duplicate and convert the data from the bipolar data appearing on leads 30 and 34 to data of a type substantially identical to that appearing on output lead 44 of elastic buffer 40. Thus, the sample and compare within test circuit 56 compares the data output by decoder 48 with that output by elastic buffer 40 and again provides this comparison over a number of clock sample times equal to the maximum amount of time that it can take the data to go through elastic buffer 40.

FIG. 3 is a simple flow diagram illustrating the concept used by control 54 in performing the test. As illustrated in block 60, it initially sets the compare count to zero and then loads in data from both the registers 50 and 46. As indicated in block 64, the data in A register 50 is maintained and a compare is made in block 66. If there is a "true" compare, then that means that there is no match error and the control 54 provides an output indicating that the compare was satisfactory. On the other hand, if there is no compare and the count is less than the maximum length of the buffer as indicated in decision block 70, a count is added to the present count and a new data bit is shifted into the B register 46, and the comparison is again provided by COMPARE 66. If there is now a "true" compare, an output is provided as indicated by block 68. If, on the other hand, there is no compare and the count in decision block 70 equals the maximum length of the buffer, the block 72 provides an indication to the control to provide an output representing a match error. The test circuit 56 can then commence another compare cycle, or if test circuit 56 comprises a multiplexing device, can be used to switch to provide a similar comparison for another circuit. This switching operation may switch to a different circuit identical to that shown in the top part of FIG. 2, thus allowing the use of the same circuitry, such as clock recovery circuit 36 and decoder 48 for providing the test, or may switch to a different type of circuitry, wherein a different front end to the test circuit 56 might be used.

The circuitry represented by the block diagram of FIG. 4 operates in a preferred embodiment to test six separate data paths. Three of these are multiplex paths and three are demultiplex paths. Within the circuit there are two data paths designated as data and monitor, where the data is applied to block 102 and the monitor data path is applied to block 124. The inputs to the data side are nonreturn-to-zero data, while the inputs to the monitor side are bipolar return-to-zero data. In the case of the multiplex channels, the monitor side inputs are representative of the input of the elastic buffer to be tested, and the data side inputs are representative of the output of the elastic buffer. In the case of the demultiplex channels, the data side inputs are representative of the inputs to the elastic buffer to be tested, and the monitor side inputs are representative of the output of the elastic buffer 40. The data side blocks are 100 and 102. The monitor side includes blocks 120, 122, 116 and 124. The remaining blocks 108, 110, 112, 114 and 126, labeled as shown, are devoted to controlling the functions of the circuit.

The DATAMUX block 100 receives data inputs from three MUX channels and three DEMUX channels. The MUX channel inputs are, in one embodiment of the invention, at a rate of 2.048 Mb/s. The DEMUX channel inputs are in the form of a single 6.312 Mb/s data stream and a synchronous clock. The 6.312 Mb/s data stream comprises three 2.048 Mb/s data streams plus overhead. The DATAMUX block 100 also has as inputs three demultiplex clocks at a frequency of 2.048 MHz that are used to extract the data for the three DEMUX channels from the 6.312 Mb/s data stream. Based on the three control inputs from the counter block 108 shown on lead 118, the DATAMUX block 100 selects one of the six input channels on leads 130 or 132 to supply data on lead 104 to DATASR block 102. The selected data is synchronized to the master clock RECCLK as supplied from clock recovery circuit 122. This is accomplished by first retiming the data with the 16 MHz clock received by both block 100 and 122. The data is then retimed again with the signal received from block 122 and is supplied on lead 104 as an input to block 102.

Block 102 comprises an 8 bit shift register in one embodiment of the invention. The serial data input supplied thereto on lead 104, is clocked by signals received from clock recovery circuit 122. The block 102 also receives a control signal labeled DHOLD from control block 112. When DHOLD is active, the shift register stops shifting bits into 102 from block 100, and holds the last eight bits to be clocked in before the DHOLD signal became active. The parallel outputs of the shift register 102 are labeled DSDT0 through DSDT7 and are supplied as inputs to the COMPARE block 126.

The MONMUX block 120 comprises two 6:1 multiplexers. The block has 12 data inputs, two for each of the six channels to be tested. For each channel, there is one data line designated as P or positive and one that is designated as N or negative. Based on three control inputs from the counter 108, the two multiplexers provide P and N data called MONP AND MONN for the same channel as selected by the DATAMUX block 100. The MONP and MONN are supplied as inputs to the clock recovery block 122.

Block 122 receives the inputs from the MONMUX block 120, and uses a 16 MHz clock G16MHZ to take the bipolar return-to-zero data and generate a synchronous clock with rising edges centered on the data pulses. The data outputs PDATA and NDATA are supplied as inputs to a further block 116 labeled HDB3DEC. The output clock labeled RECCLK is provided as master clock for the rest of the functional blocks. Block 122 also provides two synchronizing outputs to control block 112 to indicate when the clock has achieved synchronization with the data.

Block 116 serves two purposes. For the specific application shown here, it removes the zero suppression coding from the bipolar return-to-zero data. In the more general sense, it equalizes part of the fixed delay in the circuit being tested and could be any functional block that resides in the circuit being tested. It receives the data and clock signals from block 122 and clock signals from block 122 and combines this data into a single nonreturn-to zero data stream labeled MSDATA, which is supplied as an input to the monitor shift register 124.

The shift register 124 takes the data from block 116 and the clock from recovery circuit 122 and acts in accordance with an MHOLD control signal from control block 112. When the MHOLD signal is active, the shift register 124 stops shifting in bytes from the MSDATA lead of block 116. It then holds the last eight bits to be clocked in before MHOLD became active. The parallel outputs of the shift register are supplied to COMPARE block 126 and are labeled MSDT0 through MSDT7.

The COMPARE block 126 receives the eight inputs from each of the shift registers 102 and 124 and provides a single output labeled COMPVAL to the control and error register blocks 112 and 110, respectively. If the 8 bit words being coapared are identical, the COMPVAL lead is active, otherwise it is inactive.

The control block 112 serves to coordinate the functions of all the other functional blocks in the circuit. The test sequence for a given channel begins when the CONTROL state machine moves to a state designated as Y0. When this happens the output labeled SELSTB goes from a logic 0 to a logic 1 causing the counter 108 to advance one count. This action selects a new channel to be tested. The signal labeled CTLY0, which is active only when the CONTROL state machine is in state Y0, is supplied to the clock recovery block 122 to force a loss of synchronization when the CTLY0 signal is active. When loss of synchronization is indicated by the signal labeled SYNC going low, the CONTROL state machine moves to state Y1 and waits for the clock recovery block 122 to achieve synchronization once again. When the SYNC signal goes back high, the state machine moves to its next state. From state Y1, the next state depends on whether the channel being tested is a multiplex or demultiplex channel. The signal MONCTL1 is a logic 0 for multiplex channels and is a logic 1 for demultiplex channels. From state Y1 if MONCTL1 is a logic 0, the state machine then moves to state Y3 as soon as the clock recovery block 122 achieves synchronization. The state machine waits for five clock cycles to allow valid data to propagate to the output of the block 116. When the signal from the counter 114 labeled COUNT5 goes active, the state machine moves to state Y4. In state Y4, the state machine is waiting for eight valid data bits to be shifted into the MONSR block 124. When the signal from the counter block 114 labeled COUNT8 goes active, the state machine moves to state Y6 and activates the signal labeled MHOLD, which causes the monitor shift register block 124 to hold its contents. In state Y6, the state machine waits two clock cycles to equalize the fixed delay due to retiming flip-flops in the circuit being tested and in the DATAMUX block 100. When the signal from counter 114 labeled COUNT2 goes active, the state machine moves to state Y7. At this point, the monitor shift register block 124 is still holding the 8 bits that were loaded during state Y4 and all fixed delay has been equalized. The data shift register block 102 continues to load in new data bits. If the circuit being tested is maintaining bit integrity, then the signal named COMPVAL should go active before the signal labeled COUNT16 goes active. If the circuit being tested is not maintaining bit integrity, then COMPVAL will not go active. In either case, as soon as COMPVAL or COUNT16 goes active, the state machine aoves back to state 0 to begin the test sequence for the next channel.

If the MONTCL1 signal is a logic 1, indicating that a DEMUX channel is to be tested, a slightly different set of events is followed since the fixed delay is different for a DEMUX channel.

The counter 114 comprises a 4 bit binary counter. Its clock source is the signal received from block 122. It receives the inputs CTLY1 through CTLY6 from control block 112 and the sync input from block 122. These inputs along with the state of the 4 bit counter determine when the counter gets reset to an all logic $\emptyset$ state. This occurs each time the control state machine 112 enters a state that has COUNT(X) as a condition for exiting that state. The conditions for resetting the counter are when the state Y lead is logic $\emptyset$ at the same time as the SYNC lead, OR when the Y2 lead is active along with a count of 8, OR when the Y3 lead is active along with a count of 5, OR when the Y4 lead is active along with a count of 8, OR when the Y5 lead is active along with a count of 5, OR when the Y6 lead is active along with a count of 2. The resetting of counter 114 is synchronous with the clock signal RECCLK. The counter 108 comprises a divide-by-6 counter whose count sequence is $\emptyset\emptyset\emptyset$, $\emptyset\emptyset1$, $1\emptyset1$, $1\emptyset\emptyset11\emptyset$, and $\emptyset1\emptyset$. The three bits of this counter are provided as outputs to the DATAMUX block 100 and the MONMUX block 120, as shown on lead 118. All of the functional states of the counter are decoded and provided as outputs to the error register 110 to indicate which channel is being tested. The clock source for counter 108 is a signal labeled SELSTB from the control block 112, which changes from a logic $\emptyset$ to a logic 1 when the control state machine moves from state Y7 to Y$\emptyset$.

The error register block 110 generates an error signal for each channel being tested. It receives the decoded states of the counter 108 as inputs. The error register block 110 can only report errors when the control state machine 112 is in state Y7 as represented by the signal being a logic $\emptyset$. If at any time while state lead Y7 is a logic $\emptyset$ and count 16 goes active without the COMP-VAL signal being active, then the error register block 110 reports a match error. Depending upon which channel is being tested, one of the six outputs on lead 128 will go to a logic 1 for one clock cycle.

NONPRINTED APPENDICES APPEARING IN SUBJECT PATENT FILE

Appendix A is a detailed schematic block diagram of the MONMUX block 120 of FIG. 4.

Appendix B is a detailed block diagram of the DATAMUX block 100 of FIG. 4.

Appendix C is a detailed block diagram of the COUNTER 108 of FIG. 4.

Appendix D is a detailed block diagram of the ERRORREG 110 of FIG. 4.

Appendix E is a detailed block diagram of the CONTROL block 112 of FIG. 4.

Appendix F is a detailed block diagram of the COUNTER 114 of FIG. 4.

Appendix G is a detailed block diagram of block 116 of FIG. 4.

Appendix H is a detailed block diagram of the DATASR block 102 of FIG. 4.

Appendix I is a detailed block diagram of the MONSR block 124 of FIG. 4.

Appendix J is a detailed block diagram of the COMPARE block 126 of FIG. 4.

Although the present invention has been described with reference to a presently preferred embodiment, it will be appreciated by those skilled in the art that various modifications, alternatives, variations, etc. may be made without departing from the spirit and scope of the invention as defined in the appended claims, wherein we claim:

1. The method of checking data integrity of a given circuit, comprising the steps of:
   A. sampling the data input to a circuit being checked;
   B. sampling the data output from said circuit being checked;
   C. comparing the data sampled in steps A and B for identity;
   D. issuing a positive compare signal and commencing a new circuit checking operation if an identity is detected;
   E. repeating steps B and C enough times to assure passage of data completely through said circuit; and
   F. issuing a negative coapare signal and commencing a new circuit checking operation if an identity is not detected within a given maximum number of comparisons.

2. Apparatus for checking data integrity of a given circuit comprising, in combination:
   A. circuit first means, including data input means and data output means, for processing data in a data stream and which first means needs to be checked on at least a periodic basis to assure the integrity of data passing therethrough;
   B. second means, connected to said input means of said first means, for sampling the data input to said first means;
   C. third means, connected to said output means of said first means, for sampling the data output from said circuit being checked;
   D. fourth means, connected to said second and third means, for comparing the data sampled by said second and third means for identity;
   E. fifth means, comprising a part of said fourth means, for issuing a positive compare signal and causing the commencement of a new circuit checking operation by the apparatus if an identity is detected; and
   F. counting sixth means, comprising a further part of said fourth means, for repeating the operations recited in clauses B through E enough times N to assure passage of data completely through said circuit, said sixth means issuing a negative compare signal causing the commencement of a new circuit checking operation by the apparatus if an identity is not detected within N comparisons.

3. Apparatus for checking data integrity of an elastic buffer circuit comprising, in combination:
   A. elastic buffer circuit first means, including data input means and data output means, for temporarily storing data in a data stream and which first means needs to be checked on at least a periodic basis to assure the integrity of data passing therethrough;
   B. second means, connected to said input means of said first means, for sampling the data input to said first means;
   C. third means, connected to said output means of said first means, for sampling the data output from said circuit being checked;
   D. fourth means, connected to said second and third means, for comparing the data sampled by said second and third means for identity;
   E. fifth means, comprising a part of said fourth means, for issuing a positive compare signal and causing the commencement of a new circuit checking operation by the apparatus if an identity is detected; and F. counting sixth means, comprising a further part of said fourth means, for repeating the operations recited in clauses B through E enough times N to assure passage of data completely through said circuit, said sixth means issuing a negative compare signal causing the commencement of a new circuit checking operation by the apparatus if an identity is not detected within N comparisons.

4. Apparatus for multiplexing the checking of data integrity of several circuits comprising, in combination:
   A. a plurality of data input signal first means representing the data supplied to a plurality of different circuits;
   B. a plurality of data output signal second means representing the data supplied from said plurality of different circuits;
   C. multiplex circuit selection third means, connected to said first and second means, for selecting from among the data input and output signals an associated pair to be checked for data integrity;
   D. signal storage fourth means, connected to said third means, for sampling the data input signal selected;
   E. signal storage fifth means, connected to said third means, for sampling the present data output of the signal pair selected;
   F. sixth means, connected to said third, fourth and fifth means, for comparing the stored data signals for identity in accordance with the type of circuit selected;
   G. seventh means, comprising a part of said sixth means, for issuing a positive compare signal and causing the commencement of a new circuit checking operation by the apparatus if an identity is detected; and
   H. counting eighth means, comprising a further part of said sixth means, for repeating the operations recited in clauses E through G enough times N to assure passage of data completely through said circuit being checked where N may vary for different types of circuits being selected for checking said sixth means issuing a negative compare signal causing the commencement of a new circuit checking operation by the apparatus if an identity is not detected within N comparisons.

5. The method of obtaining a statistically reliable check on the integrity of data processed in each one of a plurality of circuits comprising the steps of:
   periodically and continuously checking data integrity in a circuit by comparing a given serial set of data bits input to a circuit with consecutive serial sets of data bits output by said circuit for up to enough clock times N to be sure that the data being compared has been processed by the circuit where N may have different values for different circuits being checked;
   issuing a positive compare result signal if such an identity is indicated by the comparison circuitry prior to N clock times even though the data input to the circuit may not have passed through the circuit at the time the comparison is indicated;
   issuing a negative compare result signal if such an identity is not indicated by the comparison circuitry prior to N clock times; and
   commencing the further checking of a new set of input data bits with a set of output data bits after the issuance of one of said compare result signals.

* * * * *